United States Patent
Pekny

(10) Patent No.: US 7,876,638 B2
(45) Date of Patent: Jan. 25, 2011

(54) STORING OPERATIONAL INFORMATION IN AN ARRAY OF MEMORY CELLS

(75) Inventor: Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 11/853,460

(22) Filed: Sep. 11, 2007

(65) Prior Publication Data

US 2009/0067276 A1 Mar. 12, 2009

(51) Int. Cl.
*G11C 8/00* (2006.01)

(52) U.S. Cl. .................... 365/230.03; 365/51

(58) Field of Classification Search ............ 365/230.03, 365/51
See application file for complete search history.

(56) References Cited

U.S. PATENT DOCUMENTS

| | | | |
|---|---|---|---|
| 6,167,338 A * | 12/2000 | De Wille et al. ............... | 701/51 |
| 6,532,556 B1 | 3/2003 | Wong et al. | |
| 6,549,468 B2 | 4/2003 | Zitlaw et al. | |
| 6,553,510 B1 | 4/2003 | Pekny | |
| 6,792,528 B1 | 9/2004 | Hou | |
| 7,139,192 B1 | 11/2006 | Wong | |
| 7,185,208 B2 * | 2/2007 | Gorobets .................... | 713/193 |
| 7,197,594 B2 | 3/2007 | Raz et al. | |
| 7,529,969 B1 * | 5/2009 | Patel et al. ...................... | 714/6 |
| 7,605,434 B2 * | 10/2009 | Kawano ...................... | 257/390 |
| 2001/0019501 A1 | 9/2001 | Otani et al. | |
| 2005/0066110 A1 * | 3/2005 | Raz et al. ..................... | 711/103 |
| 2005/0081013 A1 | 4/2005 | Pekny et al. | |
| 2005/0276128 A1 * | 12/2005 | Min et al. ................... | 365/200 |
| 2006/0098496 A1 | 5/2006 | Kawabata et al. | |
| 2006/0101301 A1 | 5/2006 | Nagao et al. | |
| 2006/0203548 A1 * | 9/2006 | You ....................... | 365/185.12 |
| 2007/0081411 A1 | 4/2007 | Han et al. | |
| 2007/0115720 A1 | 5/2007 | Cohen | |

OTHER PUBLICATIONS

Yoon, Hye Sook, International Search Report from related PCT application mailed Mar. 11, 2009 (3 pgs.).

* cited by examiner

*Primary Examiner*—Huan Hoang
*Assistant Examiner*—Kretelia Graham
(74) *Attorney, Agent, or Firm*—Brooks, Cameron & Huebsch, PLLC

(57) ABSTRACT

The present disclosure includes methods, devices, modules, and systems for storing operational information in an array of memory cells. One method embodiment includes storing data units of operational information in memory cells of at least one row of a first block of memory cells. The method also includes using a column scramble to shift the order of the data units. The method includes storing the data units in memory cells of at least one row of a second block of memory cells, wherein an order of the data units stored in the at least one row of the second block is different than an order of the data units stored in memory cells of the at least one row of the first block.

21 Claims, 8 Drawing Sheets

Fig. 4

STORING OPERATIONAL INFORMATION IN AN ARRAY OF MEMORY CELLS

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell in a "row" of the array are coupled to a select line. However each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on or removed from the floating gate of a memory cell to put the cell into a number of stored states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., more than one bit. MLCs can have more than one programmed state, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

Flash memory devices can be programmed with various amounts of data at one time. The amount of data programmable at one time can be referred to as a page of data. In some memory devices, one page of data includes data stored on all of the memory cells coupled to a given select line. In other memory devices, data stored on a select line can be divided into more than one page, e.g., into an even page and odd page of data. Various amounts of data can also be erased from a flash device at the same time. The amount of data erasable at one time can be referred to as a block of data. A block of data can include a number of data pages. A memory plane can include a number of data blocks on a given die. Some memory devices have multiple planes per die.

Flash memory devices can store operational information, such as column redundancy, block redundancy, fuse trim, functionality trims, etc. Operational information can be stored in a small mini-array or in the main array of memory cells. Storage in the main array can be beneficial by providing a smaller overall die size compared to a separate mini-array for the same amount of operational information. When operational information is stored in the main array, measures taken to ensure data integrity can be beneficial. One method for storing operational information in the main array includes storing the data in a single select line row with copies of the data in multiple blocks, and planes for devices having more than one plane. Because all blocks on the same plane share common sense lines, defects that prevent operational information from being read in one block can prevent it from being read in any other block on the same plane.

BRIEF DESCRIPTION OF THE DRAWINGS

FIG. 4 illustrates an operational information topology table in accordance with one or more embodiments of the present disclosure.

DETAILED DESCRIPTION

One or more embodiments of the present disclosure provide methods, devices, and systems for storing operational information in an array of memory cells. One method embodiment includes storing data units of operational information in memory cells of at least one row of a first block of memory cells. The method also includes using a column scramble to shift the order of the data units. The method includes storing the data units in memory cells of at least one row of a second block of memory cells, wherein an order of the data units stored in the at least one row of the second block is different than an order of the data units stored in memory cells of the at least one row of the first block.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
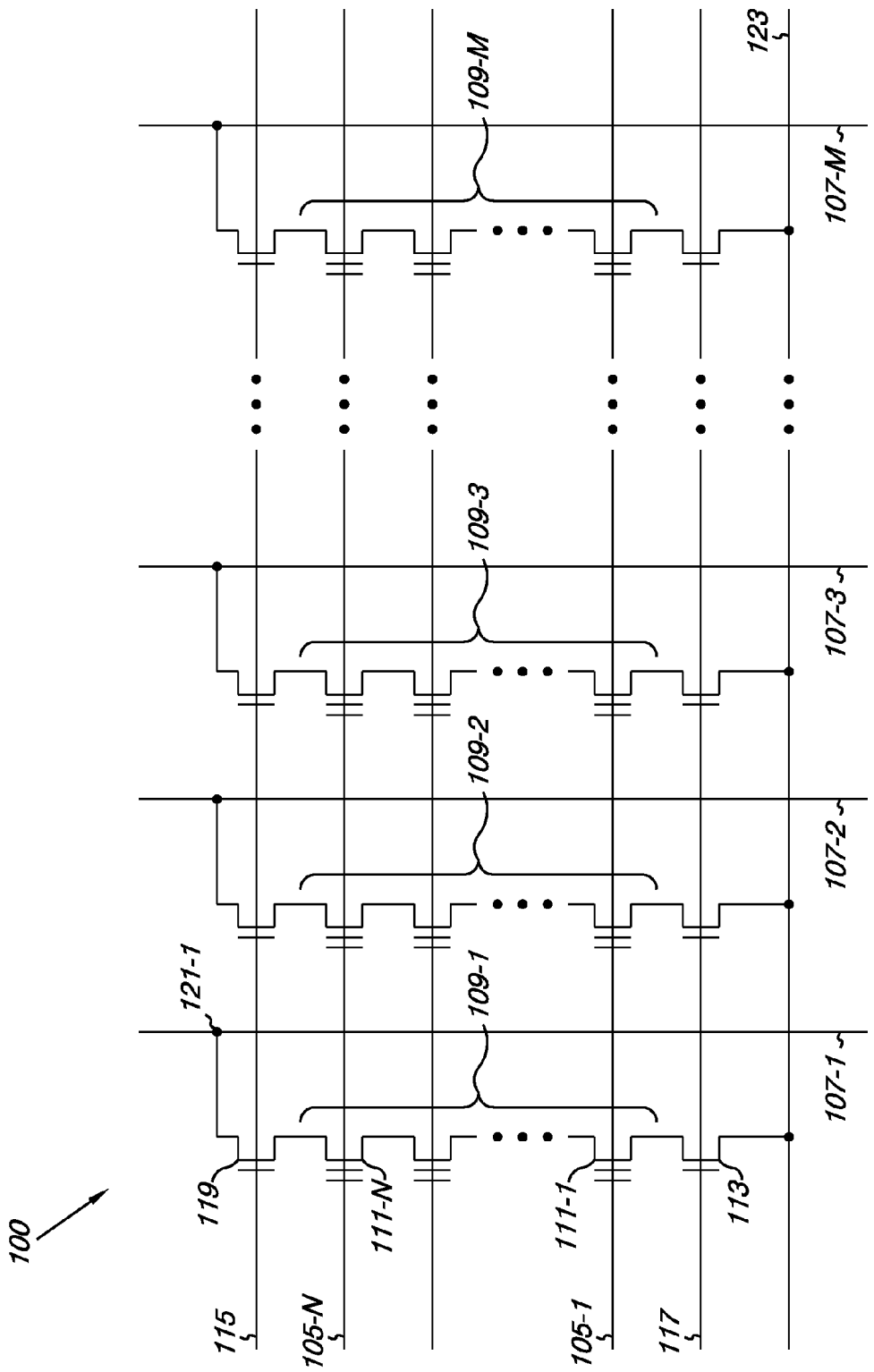
FIG. 1 is a schematic of a portion of a non-volatile memory array in accordance with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to a select line, 105-1, . . . , 105-N respectively. A column of the non-volatile memory cells, 111-1, . . . , 111-N, make up the NAND strings, e.g., 109-1, . . . , 109-M, coupled to a given local sense line, e.g., 107-1, . . . , 107-M respectively. A row of the non-volatile memory cells are those memory cells commonly coupled to a given select line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected select line, e.g., 105-1, . . . , 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. The sensing operation can involve biasing a sense line, e.g., sense line 107-1, associated with a selected memory cell at a voltage above a bias voltage for a source line, e.g., source line 123, associated with the selected memory cell. A sensing operation could alternatively include precharging the sense line 107-1 followed with discharge when a selected cell begins to conduct, and sensing the discharge.

Sensing the state of a selected cell can include applying a sensing voltage to a selected select line, while biasing the unselected cells of the string at a voltage sufficient to place the unselected cells in a conducting state independent of the threshold voltage of the unselected cells. The sense line corresponding to the selected cell being read and/or verified can be sensed to determine whether or not the selected cell conducts in response to the particular sensing voltage applied to the selected select line. For example, the state of a selected cell can be determined by the select line voltage at which the sense line current reaches a predetermined reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a predetermined amount or reaches a predetermined level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
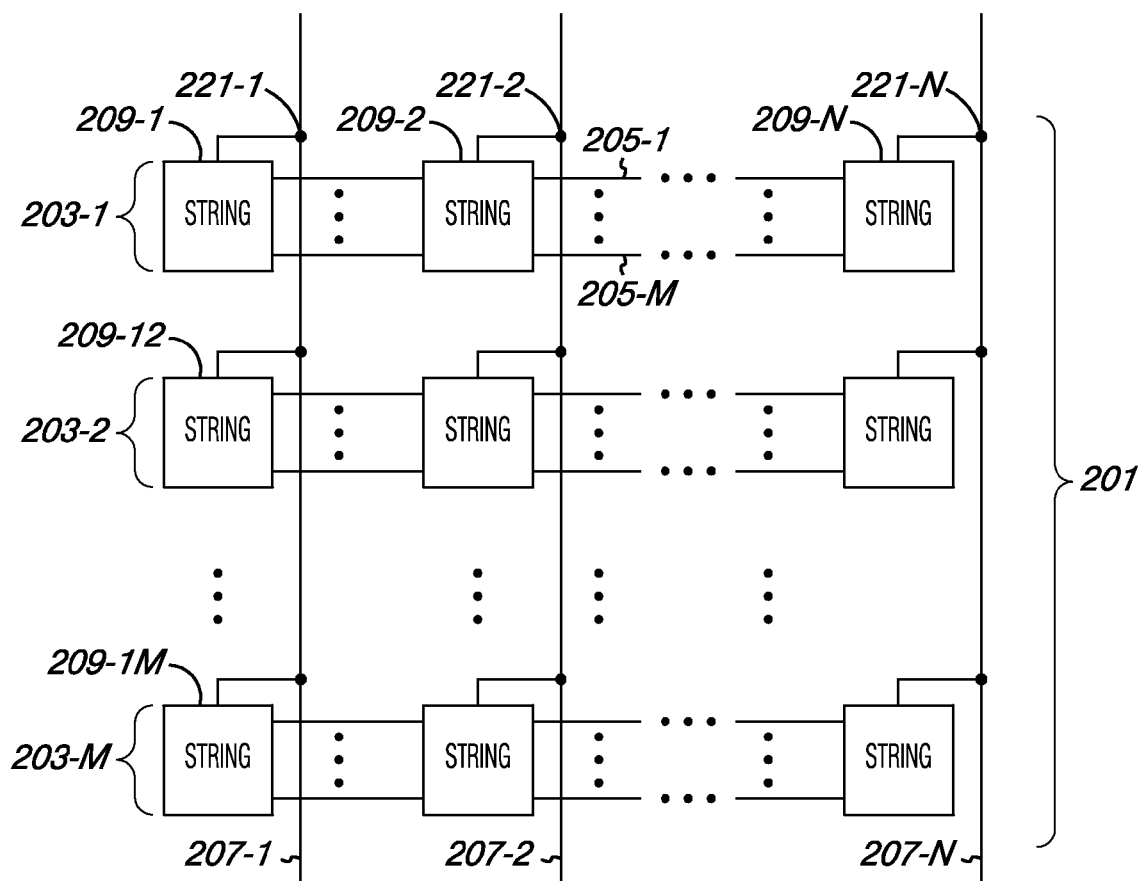
FIG. 2 is a schematic of a portion of a non-volatile memory array in accordance with one or more embodiments of the present disclosure.

FIG. 2 is a schematic of a portion of a non-volatile memory array in accordance with one or more embodiments of the present disclosure. The array illustrated in FIG. 2 has been simplified from FIG. 1 for ease of illustration with respect to elements described below. As shown in FIG. 2, the memory array includes sense lines 207-1, 207-2, . . . , 207-N coupled to strings of memory cells 209-1, 209-2, . . . , 209-N at nodes 221-1, 221-2, . . . , 221-N. Each string of memory cells, e.g., 209-1, is represented in FIG. 2 by a box containing the word "STRING." Each string of memory cells, e.g., 209-1, can contain a number of memory cells as shown at 109-1 in FIG. 1, and is arranged as described above with respect to FIG. 1.

As shown in the embodiment of FIG. 2, a number of select lines 205-1, . . . , 205-M can be coupled to strings of memory cells, e.g., 209-1, such that one memory cell per string, e.g., 111-1 in FIG. 1, is coupled to one select line, e.g., 205-1. For example, embodiments including 32 memory cells per string also include 32 select lines, e.g., 205-1, per string, e.g., 209-1.

Memory devices can be programmed on a select line by select line basis. The amount of data programmable at one time can be referred to as a page of data. In one or more embodiments, data stored on the memory cells coupled to a single select line, e.g., 205-1, can represent one page of data. In one or more embodiments, memory cells coupled to a single select line can be divided into multiple pages, e.g., two pages including a page of even numbered cells and a page of odd numbered cells, where each page is programmed separately.

The embodiment of FIG. 2 illustrates a number of blocks 203-1, 203-2, . . . , 203-M. Flash memory devices can be erased on a block by block basis. The amount of data erasable at one time can be referred to as a block, e.g., 203-1. A block can include a number of data pages. In one or more embodiments, a block, e.g., 203-1, can include all of the memory cells arranged on the rows associated with a string of memory cells. A memory plane 201 can include a number of data blocks on a given die. Some memory devices have multiple planes 201 per die, and some memory devices can have more than one die. As one of ordinary skill in the art will appreciate, certain portions of the total data storage space on a memory device may be used for overhead data, such as error correction code (ECC), and other portions may be used to store operational information.

Operational information can include column redundancy data, block redundancy data, die identifiers, functionality trim data, bandgap data, and fuse trim data among other information. Operational information can be stored in the main array of memory cells. For example, a copy of operational information can be stored on a single page, e.g., on a page of select line 205-1. In one or more embodiments, four copies of operational information can be stored per page, e.g., on a page of select line 205-1. In order to help ensure operational information integrity, blocks, e.g., 203-1, dedicated to storing operational information can have one or more pages dedicated to storing operational information, while the remaining pages can be left blank. That is, the memory cells located in pages not storing operational information in a block dedicated to storing operational information, can remain in an erased state. In one or more embodiments, four blocks per die can be dedicated to storing operational information.

As the reader will appreciate, sense lines can be common to multiple blocks. For example, sense line 207-1 is coupled to memory cells in string 209-1, which is located in block 203-1. Sense line 207-1 is also coupled to memory cells in strings 209-12, . . . , 209-1M, which are located in blocks 203-2, . . . , 203-M, respectively. Therefore, if operational information stored in block 203-1 is copied to block 203-2 using the same data pattern as the data pattern for block 203-1, then the same data units will be stored in memory cells coupled to the same sense lines. For example, if the "first" operational information unit is stored in a memory cell in string 209-1, then the "first" copied operational information unit would be stored in a memory cell coupled to string 209-12. If an error occurred such that sense line 207-1 could not be used to sense data, then all copies of the first data unit of operational information stored in blocks coupled by sense line 207-1 could not be sensed, when the same arrangement, e.g., data pattern, is used to store the data.

Figure 3A:
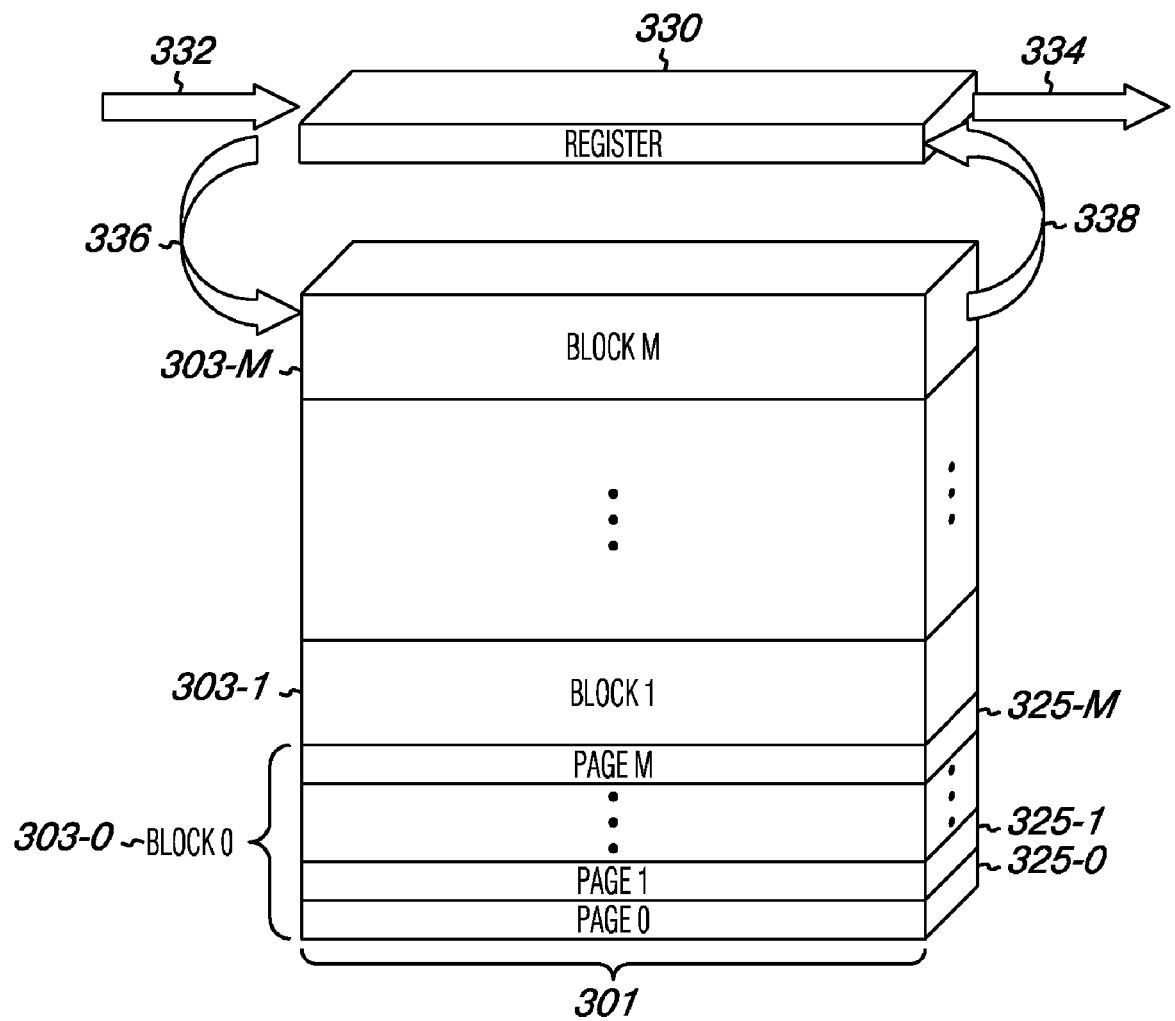
FIG. 3A illustrates a block diagram of a memory architecture in accordance with one or more embodiments of the present disclosure.

FIG. 3A illustrates a block diagram of a memory architecture in accordance with one or more embodiments of the present disclosure. The embodiment of FIG. 3A illustrates a number of pages, 325-0, 325-1, . . . , 325-M, included in Block 0, 303-0. FIG. 3A also illustrates a number of blocks 303-0, 303-1, . . . , 303-M. According to the embodiment illustrated in FIG. 3A, blocks 303-0, 303-1, . . . , 303-M together are included in plane 301.

As an example, a 2 GB memory device can include 2112 bytes of data per page, 64 pages per block, and 2048 blocks per plane. SLC devices store one bit per cell. MLC devices can store multiple bits per cell, e.g., 2 bits per cell. In a binary system, a "bit" represents one unit of data. As embodiments are not limited to a binary system, the smallest data element will be referred to herein as a "unit."

Plane 301 is shown in bidirectional communication with register 330 at 336 and 338. As one of ordinary skill in the art will appreciate, a memory device could include more than one register, e.g., a data register and a cache register. Furthermore, data can be transferred from register 330 to the memory plane 301 at 336 during programming operations. Data can also be transferred from the memory plane 301 to the register 330 during sensing operations. Register 330 can communicate data to input/output (I/O) circuitry, e.g., 660 in FIG. 6, at 334 and can receive data from I/O circuitry at 332.

Figure 3B:
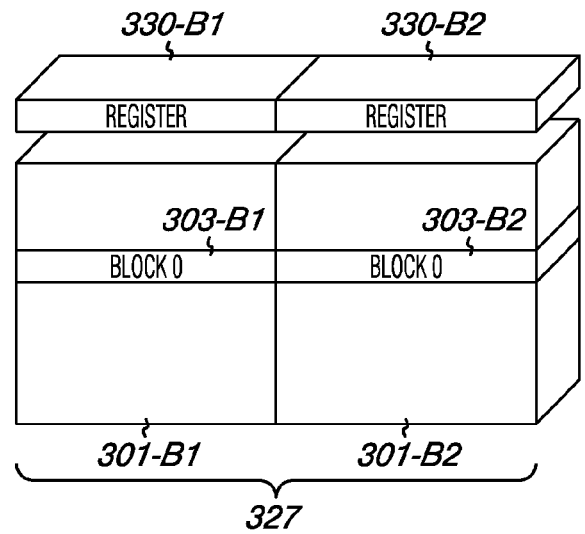
FIG. 3B illustrates a block diagram of a memory architecture in accordance with one or more embodiments of the present disclosure.

FIG. 3B illustrates a block diagram of a memory architecture in accordance with one or more embodiments of the present disclosure. FIG. 3B includes a memory die 327 with two planes 301-B1 and 301-B2. Each plane is in bidirectional communication with a register 330-B1 and 330-B2 respectively. Each register functions substantially as described above with respect to FIG. 3A.

Each plane 301-131 and 301-B2 can include a number of blocks, e.g., 303-B1 and 303-B2. As shown in the embodiment illustrated in FIG. 3B, a block is physically located near the center of plane 301-B1 and indicated as "BLOCK 0". As the reader will appreciate, storing operational information in a physical location central to the array can help ensure data integrity by reducing exposure of the operational information to interference associated with the physical edges of a memory array.

In the embodiment illustrated in FIG. 3B, plane 301-B1 represents half of the blocks on die 327, and plane 301-B2 represents the other half. In one or more embodiments, planes can be divided between odd and even numbered blocks. In one or more embodiments, an "odd" or "even" block of data can be a logical representation of data where data units from odd numbered memory cells on select lines associated with the block are stored in an "odd" block and data units from even numbered memory cells on select lines associated with the block are stored in an "even" block.

Figure 3C:
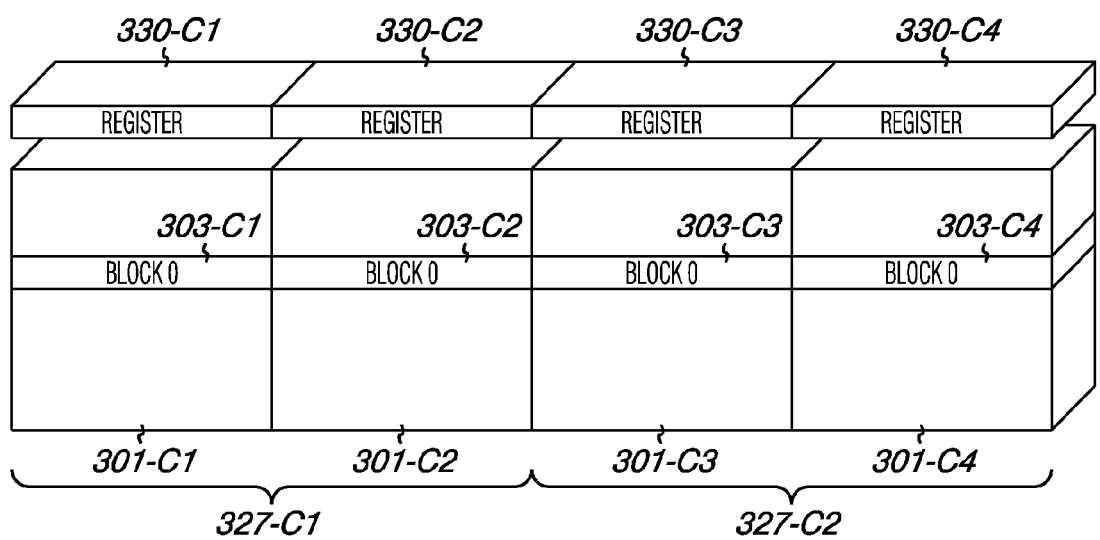
FIG. 3C illustrates a block diagram of a memory architecture in accordance with one or more embodiments of the present disclosure.

FIG. 3C illustrates a block diagram of a memory architecture in accordance with one or more embodiments of the present disclosure. FIG. 3C includes two memory dies 327-C1 and 327-C2 with two planes each, 301-C1, 301-C2, 301-C3, and 301-C4. Each plane is in bidirectional communication with a register 330-C1, 330-C2, 330-C3, and 330-C4 respectively. Each register functions substantially as described above in connection with FIG. 3A. Each plane can include a number of blocks, e.g., 303-C1, 303-C2, 303-C3, and 303-C4. As shown in FIG. 3C, a block is physically located near the center of each plane and indicated as "BLOCK 0".

In the embodiment illustrated in FIG. 3C, plane 301-C1 represents half of the blocks on die 327-C1, and plane 301-C2 represents the other half. Likewise, plane 301-C3 represents half of the blocks on die 327-C2, and plane 301-C4 represents the other half. As described in connection with FIG. 3B, planes can be divided according odd and even numbered blocks and/or odd and even numbered memory cells. For example, plane 301-C1 could represent even numbered blocks associated with die 327-C1, while plane 301-C2 could represent odd numbered blocks associated with the same die. Likewise, plane 301-C3 could represent even numbered blocks associated with die 327-C2, while plane 301-C4 could represent odd numbered blocks associated with the same die. Embodiments are not limited to memory devices with a particular number of blocks, planes, or dies.

Figure 4:
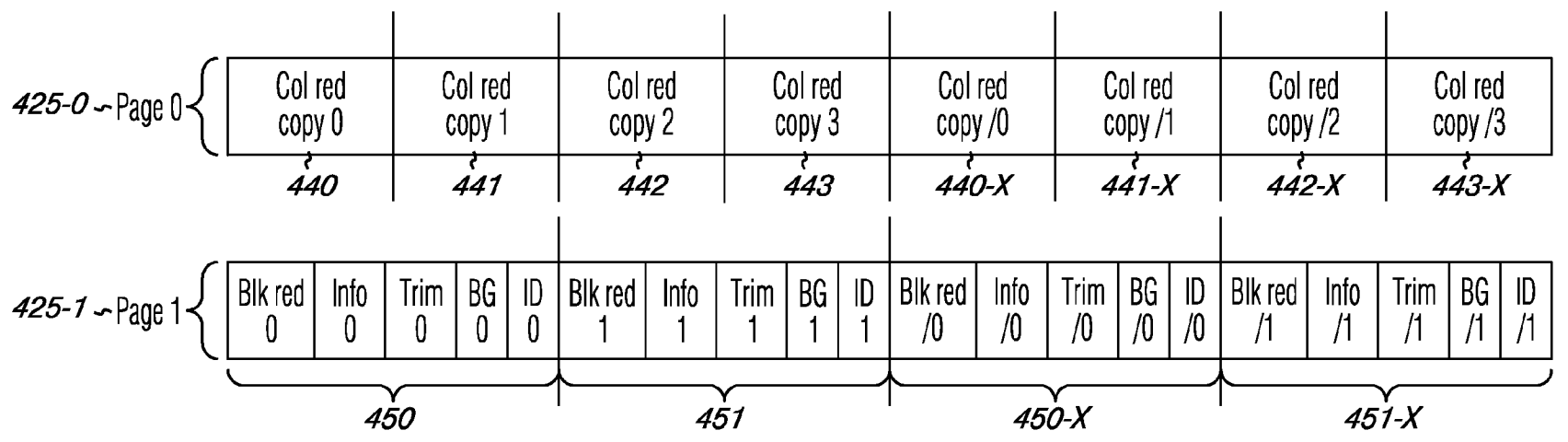

FIG. 4 illustrates an operational information topology table in accordance with one or more embodiments of the present disclosure. Operational information can be stored on a select line, e.g., 205-1 in FIG. 2. More than one copy of each set of operational information is often stored in the overall set of operational information. In the embodiment illustrated in FIG. 4, four copies (440, 441, 442, and 443) of column redundancy data "Col red" are stored in Page 0, 425-0. Also, in the embodiment illustrated in FIG. 4, two copies (450 and 451) of other operational information are stored in Page 1, 425-1. For example, "other operational information" can include block redundancy data "Blk red," die identifiers "Info," functionality trim data "Trim," bandgap data, "BG," and fuse trim data "ID." The examples of operational information included with FIG. 4 are not an exhaustive list of operational information that can be stored in a memory array in accordance with embodiments of the present disclosure. Also, as described above, Page 0, 425-0, and Page 1, 425-1, in FIG. 4 can be stored on a single select line, or on more than one select line, depending on the architecture of the particular memory device storing the operational information.

As the reader will appreciate, for each copy of operational information stored in pages 425-0 and 425-1, there is a stored copy of the inverse of the operational information, e.g., "Col red copy /0" for "Col red copy 0." Inverse copies of operational information can be stored for column redundancy, e.g., 440-X, 441-X, 442-X, and 443-X, as well as for other operational information, e.g., 450-X and 451-X.

During a power-up ROM fuse read operation, a memory device can function to read a first copy of operational information, e.g., "Col red copy 0" 440, and compare it to the inverse, e.g., "Col red copy /0" 440-X. If the copy and inverse copy are exact opposites, then they constitute a valid set of operational information. For example, in an SLC memory device, "inverse" or "opposite" data for a particular data unit could be 0 and 1, e.g., a memory cell in an erased state and a memory cell in a programmed state. As one of ordinary skill in the art will appreciate, similar schemes for defining opposite data states can be established for MLC devices. If the copy and inverse copy are not exact opposites, e.g., if either the copy or inverse copy contain an error, the set of operational information is considered invalid and the memory device can function to sense the next copy, e.g., "Col red copy 1" 441.

In addition to storing multiple copies of each set of operational information on a select line, multiple copies of the entire collection of operational information can be stored on different blocks, e.g., 203-1 and 203-2 in FIG. 2, within the memory device. Devices including multiple planes, e.g., 301-B1 and 301-B2 in FIG. 3B, can store copies of operational information on the multiple planes. Devices including more than one die, e.g., 327-C1 and 327-C2 in FIG. 3C, can store copies of operational information on more than one die.

Figure 5A:
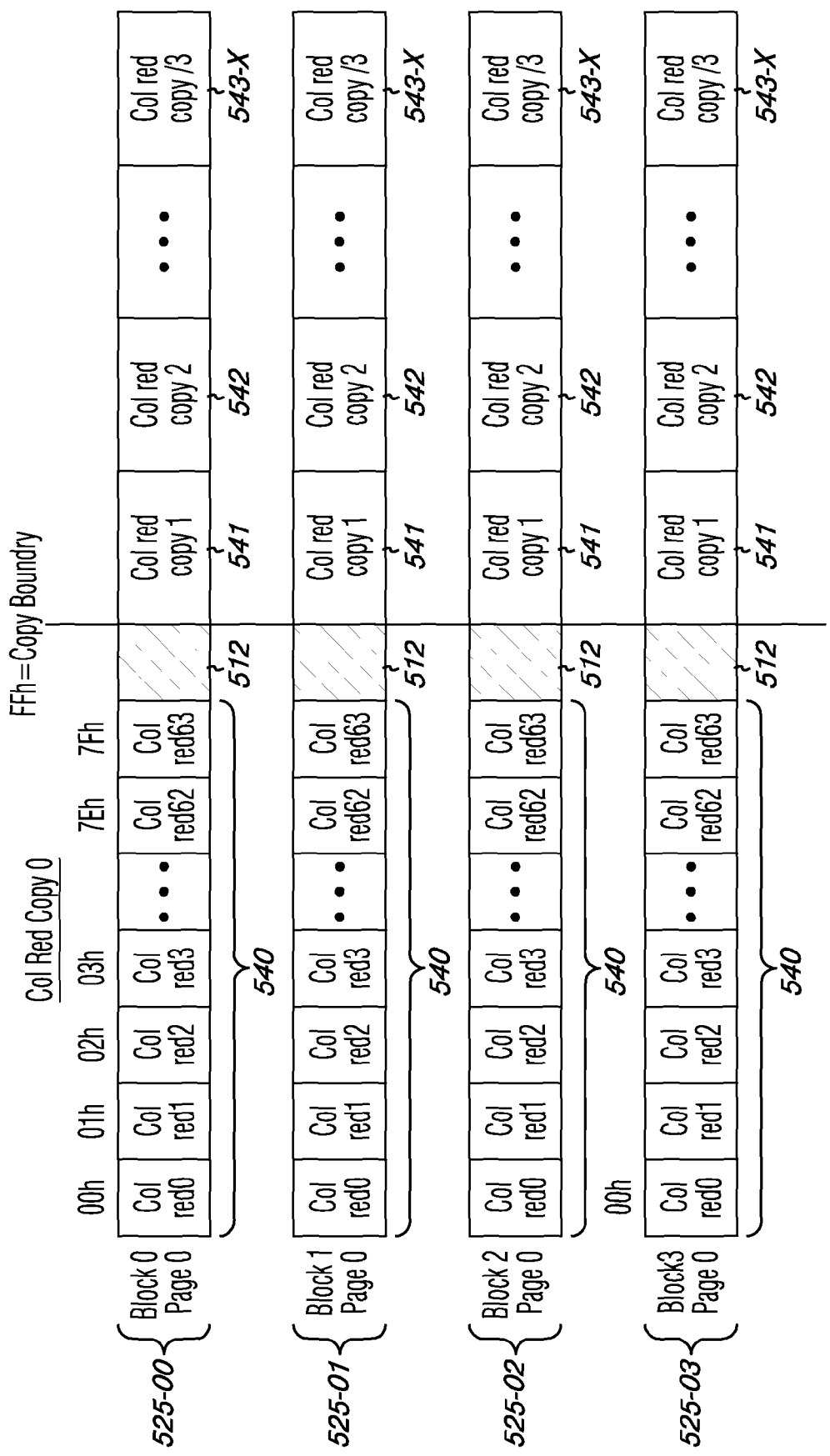
FIG. 5A illustrates expanded views of an operational information topology table in accordance with a previous approach.

FIG. 5A illustrates expanded views of an operational information topology table in accordance with a previous approach. Each row (525-00, 525-01, 525-02, 525-03) of the operational information topology table in FIG. 5A represents a copy of Page 0, 425-0 in FIG. 4. In FIG. 5A, "Col Red Copy 0," 540, is illustrated in an expanded view to display individual data units stored within copy 0 of column redundancy operational information in more detail. "Col red copy 1," "Col red copy 2," . . . , "Col red copy /3" are illustrated in a non-expanded view, as in FIG. 4, at 541, 542, . . . , 543-X in FIG. 5A. As shown in FIG. 5A, a copy of operational information stored in Page 0 of Block 0, 525-00, is stored in Page 0 of Block 1, 2, and 3.

In the embodiment illustrated in FIG. 5A, element 540 includes a number of individual data units, Col red0, Col red1, Col red2, Col red3, . . . , Col red62, Col red63. Although the embodiment illustrated in FIG. 5A includes 64 data units of column redundancy operational information, embodiments are not so limited. Any number of data units, consistent with available storage space, could be included with one or more components of operational information.

As illustrated in FIG. 5A, multiples copies of operational information may be stored on a single row, e.g., Col red copy 1, Col red copy 2, . . . , Col red copy /3, in 525-00. As described above, elements 541, 542, . . . , 543-X, indicate that one or more copies of operational information, and its inverse, are stored in a single row. Multiple copies of operational information may also be stored on different rows, e.g., different blocks, associated with different select lines, e.g., 525-01, 525-02, 525-03. One or more pages in one or more blocks may be dedicated to storing operational information for a given memory device. In one or more embodiments, pages of memory cells that are not used to store operational information, but which are located in blocks dedicated to storing operational information, are left in an erased state, e.g., are not programmed with any data.

In one or more embodiments, operational information can be stored on rows physically located near the center of a block, e.g., 201 in FIG. 2, of memory cells. Likewise, in one or more embodiments, operational information can be stored in blocks, e.g., 303-B1 in FIG. 3B, of memory cells physically located near the center of a plane of memory cells. Such embodiments can function to prevent edge effects, known and understood by one of ordinary skill in the art, from compromising the operational information stored in such reserved locations. Furthermore, within a page or block of memory cells dedicated to storing operational information, memory cells not used for storing operational information, e.g., 512, in one or more embodiments, can remain in an erased state to minimize the potential effects of programming interference or capacitive coupling between adjacent cells, as will be understood by one of ordinary skill in the art.

As illustrated in FIG. 5A, each row, e.g., 525-00, represents a copy of all sets of column redundancy data and the inverse thereof 540, 541, 542 . . . 543-X. Row 525-00 represents a copy stored in Block 0, Page 0. Row 525-01 represents a copy stored in Block 1, Page 0. Row 525-02 represents a copy stored in Block 2, Page 0. Row 525-03 represents a copy stored in Block 3, Page 0. As one of ordinary skill in the art will appreciate, any row, e.g., 325-0 in FIG. 3A, of a block, e.g., 303-0 in FIG. 3A, of memory cells can be dedicated to storing operational information. Likewise, any block of a plane, e.g., 301 in FIG. 3A, of memory cells can be dedicated to storing operational information.

The embodiment illustrated in FIG. 5A includes examples of hexadecimal addresses, e.g., 00h, 01h, 02h, 03h, . . . , 7Eh, 7Fh, corresponding to individual sense lines, for each data unit. As the reader will appreciate, FIG. 5A is not drawn to scale. For example, element 540, including "Col Red Copy 0" contains the same amount of operational information as element 541, "Col red copy 1." Furthermore, element 512, representing a number of memory cells remaining in an erased state appears similar in size to "Col red63" in element 540, which is shown in one column, 7Fh. The embodiment illustrated in FIG. 5A includes reduced and varying scales for ease of illustration.

As illustrated in FIG. 5A, according to a previous approach, each copy of Col Red Copy 0, 540, has the same data units stored on the memory cells coupled to a common sense line. For example, "Col red0" is stored in column 00h in 525-00, and is also stored in column 00h in 525-01, 525-02, and 525-03. Hexadecimal address FFh is illustrated as the copy boundary for the set of operational information including 540 and erased memory cells 512. Thus, each copy, e.g., 541, of operational information 540 includes the same number of cells. As the reader will appreciate, each hexadecimal address can be associated with one sense line, e.g., 207-1 in FIG. 2, common to multiple blocks.

Figure 5B:
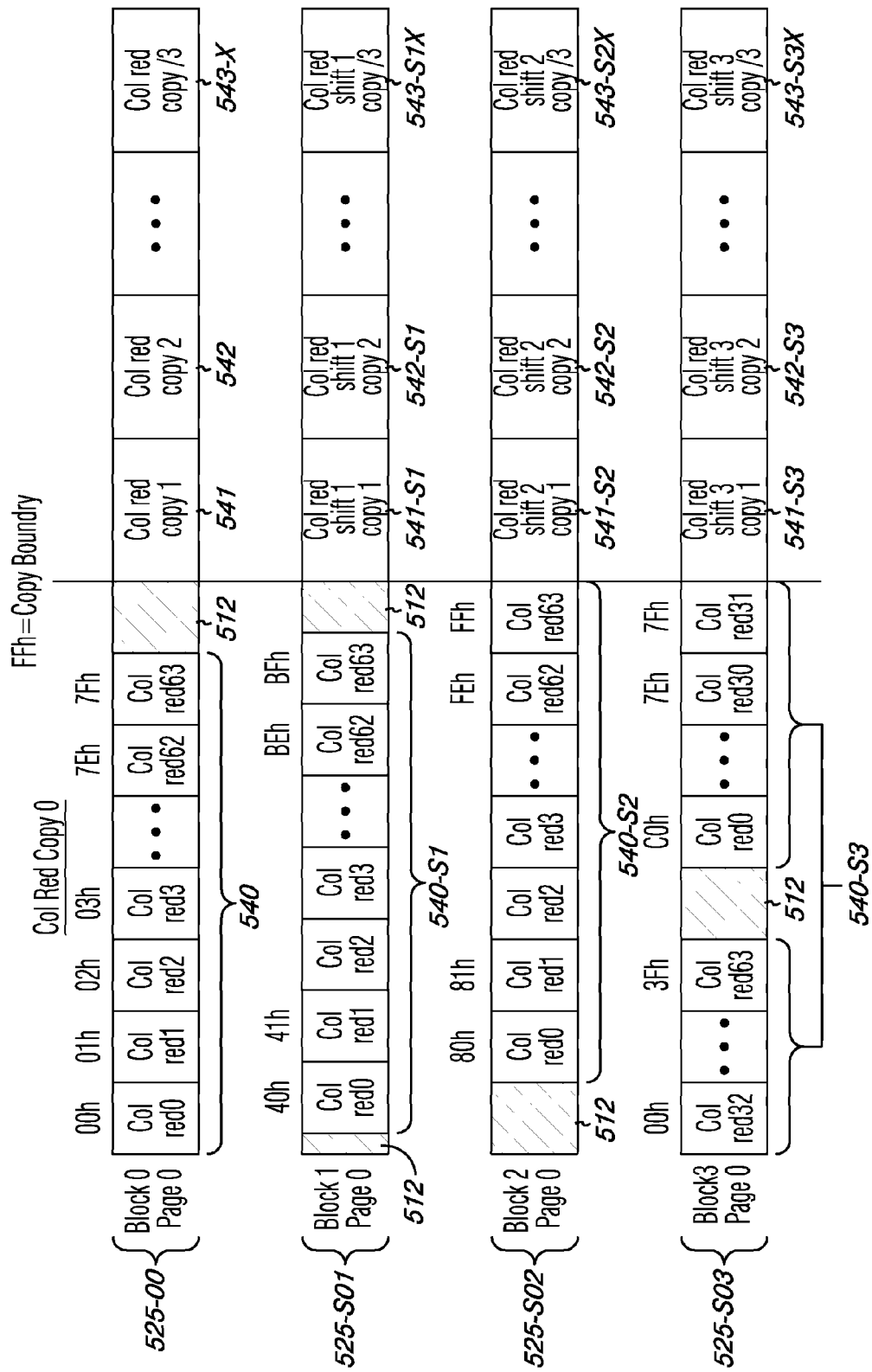
FIG. 5B illustrates expanded views of an operational information topology table in accordance with one or more embodiments of the present disclosure.

FIG. 5B illustrates expanded views of an operational information topology table in accordance with one or more embodiments of the present disclosure. Each row (525-00, 525-S01, 525-S02, 525-S03) of the operational information topology table in FIG. 5B represents a copy of Page 0, 425-0 in FIG. 4. In FIG. 5B, "Col red copy 0," 540, is illustrated as an expanded view to display individual data units, e.g., Col red0, Col red1, Col red2, Col red3, . . . , Col red 62, Col red63, stored within copy 0 of column redundancy operational information, "Col Red Copy 0," in more detail. Col red copy 1, Col red copy 2, . . . , Col red copy /3 are illustrated in a non-expanded view, as in FIG. 4, at 541, 542, . . . , 543-X in FIG. 5B.

As illustrated in FIG. 5B, multiples copies of operational information maybe stored on a single row and also on different rows, e.g., different blocks associated with different select lines. One or more pages in one or more blocks may be dedicated to storing operational information for a given memory device. According to one or more embodiments of the present disclosure, a hierarchical sensing order can be assigned to copies of operational information, instructing control circuitry as to an order in which copies of operational information should be sensed. A hierarchical sensing order can be assigned to copies of operational information within a row, and also to copies of operational information on different rows. Control circuitry can operate to sense a copy of operational information assigned a first priority level during a power-up operation. If the copy of operational information assigned a first priority level returns an error, e.g., if Col red copy 0 is not the opposite of Col red copy /0, then control circuitry can sense a copy of operational information assigned a second priority level. Embodiments of the present disclosure are not limited to a particular number of priority levels.

In embodiments including SLC devices, each data unit, e.g., "Col red0," included in element 540, can be stored in a memory cell coupled to the select line, e.g., 205-1 in FIG. 2, associated with "Block 0" and a corresponding sense line, e.g., 207-1 in FIG. 2. However, each data unit included in element 540 can be stored in a memory cell coupled to a sense line different than each other data unit within 540.

The embodiment illustrated in FIG. 5B also includes examples of hexadecimal addresses, e.g., 00h, 01h, 02h, 03h, . . . , 7Eh, 7Fh, corresponding to individual sense lines, for each data unit. As the reader will appreciate, FIG. 5B is not drawn to scale. For example, element 540, including "Col Red Copy 0" contains the same amount of operational information as element 541, "Col red copy 1." Furthermore, data unit "Col red0" in element 540-S1 is shown in column 40h, but appears very close to "Col red0" in element 540, which is shown in column 00h. The embodiment illustrated in FIG. 5B includes reduced and varying scales for ease of illustration.

The embodiment illustrated in FIG. 5B shows operational information elements included in elements 540, 540-S1, 540-S2, and 540-S3 stored in a sequential order in successive memory cells coupled by a select line associated with "Page 0" of each block. As is illustrated in FIG. 5A, each shifted copy of "Col Red Copy 0" begins with data unit "Col red0" stored on a memory cell coupled to a select line of a row with a different hexadecimal address.

Hexadecimal addresses included in FIG. 5B illustrate that operational information stored at element 540, can be copied according to a column scramble and stored in different blocks 525-S01, 525-S02, and 525-S03 at 540-S1, 540-S2, and 540-S3 respectively. The use of a column scramble to shift the order in which operational information is stored can include storing one or more data units in different columns, i.e., on different sense lines, in different blocks. For example, operational information unit "Col red 1" is shown in column 41h in Page 0 of Block 1, 525-S01, however it is shown in column 81h in Page 0 of Block 2, 525-S02. The use of a column scramble, as described herein can help preserve data integrity of operational information stored within an array of memory cells by reducing the effects of a faulty sense line, e.g., 207-1 in FIG. 2. Changing the pattern in which copies of operational information are stored allows individual data units to be stored in memory cells coupled to different sense lines. Thus, a faulty sense line that corrupts one copy of operational information, will not necessarily corrupt copies stored on different blocks even if the different blocks share common sense lines.

In one or more embodiments, copies of operational information can be shifted such that sense lines, coupled to memory cells storing operational information in one block, are coupled to memory cells that do not store operational information in a second block. For example, in FIG. 5B, column 00h stores operational information unit "Col red 0" in Page 0 of Block 0, 525-00. However, in Page 0 of Block 1, 525-S01, the memory cell coupled to column 00h does not store data as indicated by an element 512. The one or more columns included in elements 512 indicate that data is not stored in memory cells coupled to those columns, e.g., the memory cells are left in an erased state.

The embodiment illustrated in FIG. 5B illustrates non-expanded copies of operational information shifted according to the column scramble, e.g., "Col red shift 1 copy 1," "Col red shift 1 copy 2," . . . , "Col red shift 1 copy /3." As the reader will appreciate, "shift 1" corresponds to data shifted according to a first column scramble in 525-S01, "shift 2" corresponds to data shifted according to a second column scramble in 525-S02, and "shift 3" corresponds to data shifted according to a third column scramble in 525-S03. Embodiments are not limited to a particular number of copies of operational information or a particular number of shifts of operational information. Also, as described above, each row can contain opposite copies of each set of operational information, e.g., "Col red shift 1 copy /3," as indicated by the slash mark before the copy number.

As one of ordinary skill in the art will appreciate, any row, e.g., 325-0 in FIG. 3A, of a block, e.g., 303-0 in FIG. 3A, of memory cells can be reserved for operational information. Likewise, any block of a plane, e.g., 301 in FIG. 3A, of memory cells can be reserved for storing operational information. In one or more embodiments, operational information can be stored on rows physically located near the center of a block, e.g., 201 in FIG. 2, of memory cells as described above in connection with FIG. 5A.

Figure 6:
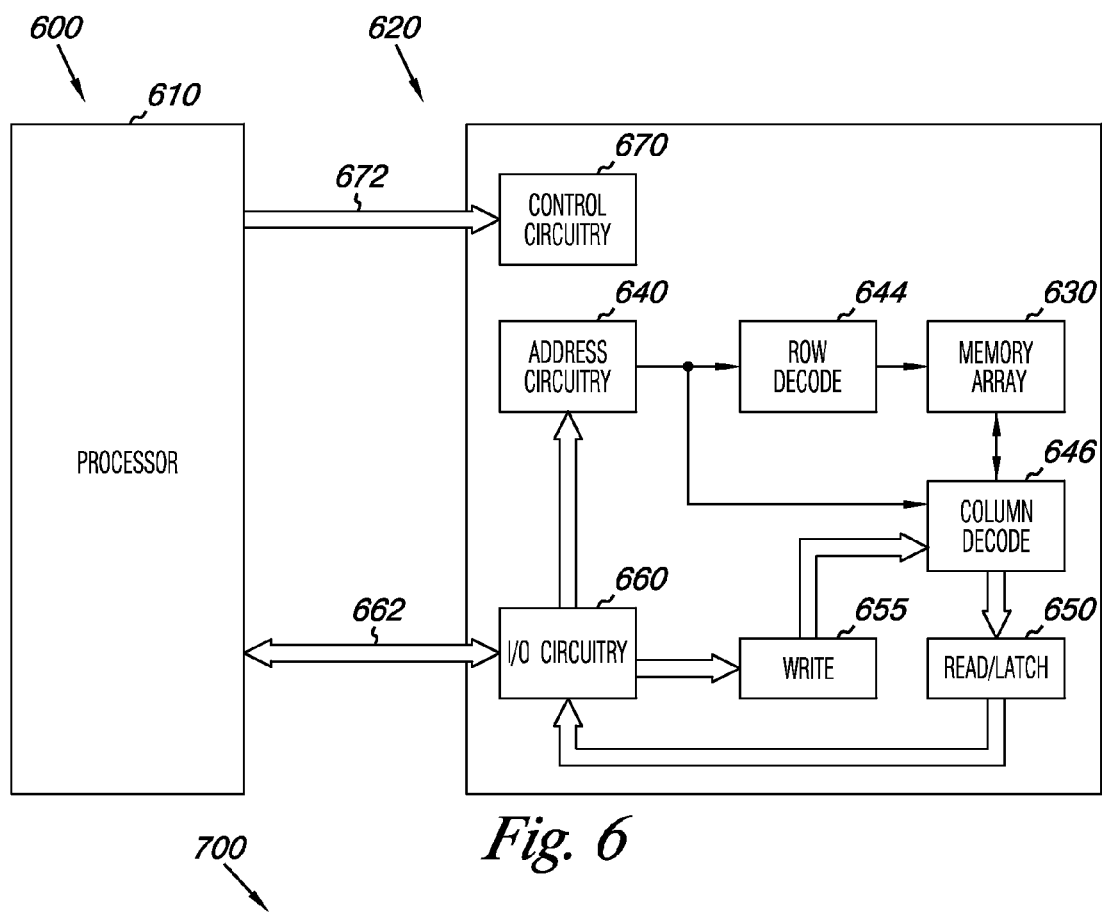
FIG. 6 is a functional block diagram of an electronic memory system having at least one memory device operated in accordance with one or more embodiments of the present disclosure.

FIG. 6 is a functional block diagram of an electronic memory system 600 having at least one memory device 620 operated in accordance with one or more embodiments of the present disclosure. Memory system 600 includes a processor 610 coupled to a non-volatile memory device 620 that includes a memory array 630 of multilevel non-volatile cells. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

The memory device 620 includes an array of non-volatile memory cells 630, which can be floating gate flash memory cells with a NAND architecture. The control gates of memory cells of a "row" are coupled with a select line, while the drain regions of the memory cells of a "column" are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory array 630 of non-volatile cells can include non-volatile multilevel memory cells having different numbers of program states, sensing voltages, and numbers of digits according to embodiments described herein. The memory device 620 senses data in the memory array 630 by sensing voltage and/or current changes in the memory array columns using sense/buffer circuitry that in this embodiment can be read/latch circuitry 650. The read/latch circuitry 650 can read and latch a page, e.g., a row, of data from the memory array 630. I/O circuitry 660 is included for bidirectional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including data sensing, data write, and data erase operations. In one or more embodiments, the control circuitry 670 is responsible for executing instructions from the processor 610 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
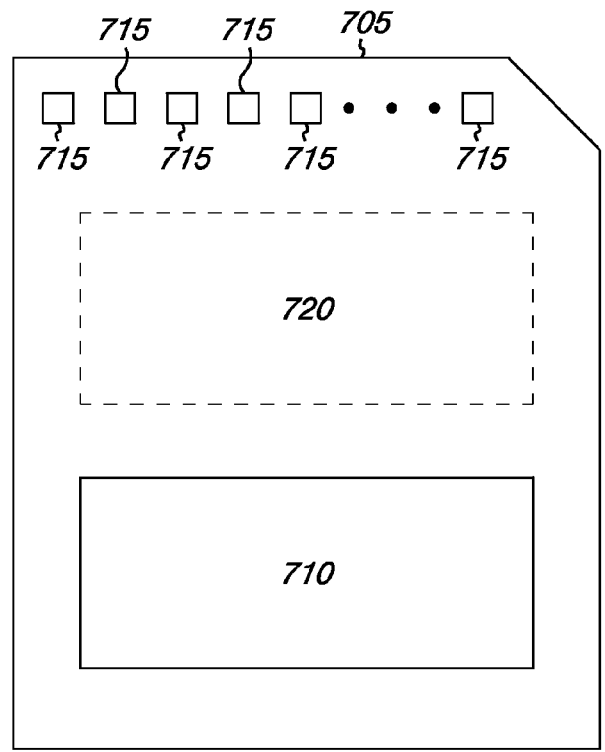
FIG. 7 is a functional block diagram of a memory module having at least one memory device in accordance with one or more embodiments of the present disclosure.

FIG. 7 is a functional block diagram of a memory module having at least one memory device programmed in accordance with one or more embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In one or more embodiments, memory module 700 will include a housing 705 (as depicted) to enclose one or more memory devices 710, though such a housing is not essential to all devices or device applications. At least one memory device 710 includes an array of non-volatile multilevel memory cells that can be sensed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For one or more embodiments, the contacts 715 are in the form of a standardized interface. For example, with a USB flash drive, the contacts 715 might be in the form of a USB Type-A male connector. For one or more embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For one or more embodiments, the additional circuitry 720 may include control circuitry, such as a memory controller, for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences, The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices, modules, and systems for storing operational information in an array of memory cells. One method embodiment includes storing data units of operational information in memory cells of at least one row of a first block of memory cells. The method also includes using a column scramble to shift the order of the data units. The method includes storing the data units in memory cells of at least one row of a second block of memory cells, wherein an order of the data units stored in the at least one row of the second block is different than an order of the data units stored in memory cells of the at least one row of the first block.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for storing operational information in an array of memory cells, comprising:
   storing data units of a set of operational information in memory cells of at least one row of a first block of memory cells, wherein the set of operational information comprises one of the group including:
   column redundancy data;
   block redundancy data;
   die identifiers;
   functionality trim data;
   bandgap data; and
   fuse trim data;
   storing a copy of an inverse of the data units in memory cells of the at least one row of the first block; and
   storing the data units in memory cells of at least one row of a second block of memory cells, wherein an order of the data units stored in the at least one row of the second block is different than an order of the data units stored in memory cells of the at least one row of the first block.

2. The method of claim 1, wherein the order of the data units stored in the at least one row of the second block is different such that a particular data unit stored in a memory cell coupled to a column in the first block is stored in a memory cell coupled to a different column in the second block.

3. The method of claim 1, wherein the order of the data units stored in the at least one row of the second block is different such that all data units stored in memory cells coupled to columns in the first block are stored in memory cells coupled to different columns in the second block.

4. The method of claim 1, wherein the order of the data units stored in the at least one row of the second block is different such that columns coupled to memory cells storing one or more data units in the first block are coupled to memory cells not storing data units in the second block.

5. The method of claim 1, wherein the method includes storing the data units in more than two blocks.

6. The method of claim 5, wherein the method includes storing the data units in adjacent data blocks.

7. The method of claim 1, wherein the method includes storing a copy of the inverse of the data units in memory cells of the at least one row of the second block in a different order than an order in which the copy of the inverse of the data units is stored in the first block.

8. A memory device, comprising:
   an array of memory cells, wherein a first number of memory cells constitute a page, and a second number of memory cells constitute a block;
   a first block and a second block dedicated to storing operational information, wherein the first block and the second block each have a different data pattern, wherein memory cells in pages not used for storing operational information in the first block and second block remain in an erased state; and
   control circuitry coupled to the array, wherein the control circuitry is operable to sense the first block and the second block and wherein the control circuitry is operable to sense the second block when the first block contains an error.

9. The device of claim 8, wherein the second block is dedicated to storing a copy of operational information stored in the first block.

10. The device of claim 8, wherein operational information stored in the first block and the second block is stored in at least one page per block.

11. The device of claim 10, wherein the at least one page per block stores a set of operational information and a copy thereof.

12. The device of claim 11, wherein the set of operational information is selected from the group including:
    column redundancy data;
    block redundancy data;
    die identifiers;
    functionality trim data;
    bandgap data; and
    fuse trim data.

13. The device of claim 8, wherein the device includes an array of memory cells arranged in a single plane.

14. The device of claim 8, wherein the device includes arrays of memory cells arranged in at least two planes.

15. A method for storing operational information in an array of memory cells, comprising:
    storing data units of operational information in memory cells of at least one row of a first block of memory cells; and
    storing the data units in memory cells of at least one row of a second block of memory cells, wherein an order of the data units stored in the at least one row of the second block is different than an order of the data units stored in memory cells of the at least one row of the first block such that columns coupled to memory cells storing one or more data units in the first block are coupled to memory cells not storing data units in the second block.

16. The method of claim 15, wherein the method includes storing a copy of an inverse of the data units in memory cells of the at least one row of the first block.

17. The method of claim 16, wherein the method includes storing a copy of the inverse of the data units in memory cells of the at least one row of the second block in a different order than an order in which the copy of the inverse of the data units is stored in the first block.

18. A memory device, comprising:
an array of memory cells, wherein a first number of memory cells constitute a page, and a second number of memory cells constitute a block;
a first block and a second block dedicated to storing operational information, wherein:
the first block and the second block each have a different data pattern;
operational information stored in the first block and the second block is stored in at least one page per block; and
the at least one page per block stores a set of operational information and a copy of an inverse of the operational information, wherein the set of operational information is selected from the group including:
column redundancy data;
block redundancy data;
die identifiers;
functionality trim data;
bandgap data; and
fuse trim data; and
control circuitry coupled to the array, wherein the control circuitry is operable to sense the first block and the second block.

19. The memory device of claim 18, wherein each of a number of pages are each coupled to a respective one of a number of select lines and wherein a number of memory cells are coupled to one of a number of sense lines.

20. The memory device of claim 19, wherein the different data pattern is a data pattern in which the operational information is stored in the second block shifted by a number of columns.

21. The memory device of claim 20, wherein the data pattern is shifted by a number of columns sufficient to prevent a data unit of operational information in the first block from being stored in a memory cell coupled to a common sense line with a corresponding data unit of operational information in the second block.

* * * * *